United States Patent
Fanet et al.

(10) Patent No.: US 10,819,344 B2
(45) Date of Patent: Oct. 27, 2020

(54) CAPACITIVE LOGIC CELL

(71) Applicant: Commissariat à l'Énergie Atomique et aux Énergies Alternatives, Paris (FR)

(72) Inventors: Hervé Fanet, Revel (FR); Gaël Pillonnet, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/673,718

(22) Filed: Nov. 4, 2019

(65) Prior Publication Data

US 2020/0153436 A1    May 14, 2020

(30) Foreign Application Priority Data

Nov. 14, 2018 (FR) ..................... 18 71519

(51) Int. Cl.
*H03K 19/09* (2006.01)
*H03K 19/0944* (2006.01)

(52) U.S. Cl.
CPC ......... *H03K 19/09* (2013.01); *H03K 19/0944* (2013.01)

(58) Field of Classification Search
None
See application file for complete search history.

(56) References Cited

U.S. PATENT DOCUMENTS

| 2011/0309889 A1* | 12/2011 | Matsuzaki | H03K 3/017 331/111 |
| 2014/0021828 A1* | 1/2014 | Despesse | H02N 2/181 310/319 |
| 2017/0179954 A1* | 6/2017 | Fanet | H03K 19/0019 |

FOREIGN PATENT DOCUMENTS

| EP | 1 067 692 A1 | 1/2001 |
| EP | 3 182 590 A1 | 6/2017 |

OTHER PUBLICATIONS

Preliminary Search Report for French Application No. 1871519, dated May 29, 2019.
Fanet et al., Adiabatic Capacitive Logic: a Paradigm for Low-Power Logic. 2017 IEEE International Symposium on Circuits and Systems (ISCAS).May 28, 2017:1-4.
Galisultanov et al., Capacitive-Based Adiabatic Logic. International Conference on Reversible Computation Jul. 6, 2017:52-65.

* cited by examiner

*Primary Examiner* — Jany Richardson
(74) *Attorney, Agent, or Firm* — Wolf, Greenfield & Sacks, P.C.

(57) ABSTRACT

A logic cell, including a first capacitor connected between an application node for applying a supply voltage of the cell and a floating node for providing an output logic signal of the cell, and, connected in parallel with the first capacitor, an association in series of a second capacitor and a first variable-resistance element, the first variable-resistance element including a control electrode connected to an application node for applying a first input logic signal of the cell.

16 Claims, 5 Drawing Sheets

CAPACITIVE LOGIC CELL

This application claims priority to French Patent application number 18/71519, filed on Nov. 14, 2018, the content of which is hereby incorporated by reference in its entirety to the maximum extent allowable by low.

TECHNICAL FIELD

The present disclosure relates to the field of electronic circuits comprising cells that implement logic functions, also known as logic cells or logic gates. The present disclosure relates more specifically to logic cells with a low electrical consumption and an electronic circuit comprising such cells.

BACKGROUND ART

The applicant has already proposed, in the patent application EP3182590 (B14590-DD16568), example embodiments of elementary logic cells based on variable-capacitance capacitors and more specifically electromechanically controlled variable-capacitance capacitors. These cells can be cascaded in series and/or in parallel for implementing more complex logic functions.

The use of capacitive logic cells makes it possible to realize logic cells with a very low electrical consumption. Indeed, this makes it possible to eliminate leakage currents, which are a factor limiting classic logic circuits, and in particular logic circuits that are realised based on transistors.

However, a limitation of the logic cells described in the aforementioned patent application EP3182590 lies in their relatively complex manufacture and/or in the relatively large space required by the variable-capacitance capacitors.

SUMMARY OF INVENTION

Thus, one embodiment provides a logic cell, comprising:
a first capacitor connected between an application node for applying a supply voltage of the cell and a floating node for providing an output logic signal of the cell; and
connected in parallel with the first capacitor, an association in series of a second capacitor and a first variable-resistance element, the first variable-resistance element comprising a control electrode connected to an application node for applying a first input logic signal of the cell.

According to an embodiment, the first variable-resistance element is an element with a negative resistance variation.

According to an embodiment, the first variable-resistance element is an element with a positive resistance variation.

According to an embodiment, the first variable-resistance element is a MOS transistor.

According to an embodiment, the first variable-resistance element is an electromechanical relay.

According to an embodiment, the cell further comprises, connected in parallel with the first capacitor, an association in series of a third capacitor and a second variable-resistance element, the second variable-resistance element comprising a control electrode connected to an application node for applying a second input logic signal of the cell.

According to an embodiment, the cell further comprises a capacitive maintaining circuit connected between the supply node and the floating node of the cell.

According to an embodiment, the capacitive maintaining circuit comprises an association in series of a capacitor and a variable-resistance element.

According to an embodiment, the cell further comprises a restarting circuit connected between the floating node and a node for applying a reference potential of the cell.

According to an embodiment, the restarting circuit comprises a variable-resistance element connected between the floating node and the application node for applying a reference potential of the cell.

According to an embodiment, the cell further comprises:
an additional first capacitor connected between the supply-voltage application node of the cell and an additional floating node for providing a complementary output logic signal of the cell; and
connected in parallel with the additional first capacitor, an association in series of an additional second capacitor and an additional first variable-resistance element, the additional first variable-resistance element comprising a control electrode connected to an application node for applying a complementary first input logic signal of the cell.

According to an embodiment, the cell further comprises an additional capacitive maintaining circuit, the additional capacitive maintaining circuit comprising an association in series of a capacitor and a variable-resistance element connected between the supply node and the additional floating node of the cell.

According to one embodiment:
the variable-resistance element of the capacitive maintaining circuit has a control terminal connected to the additional floating node of the cell; and
the variable-resistance element of the additional capacitive maintaining circuit has a control terminal connected to the floating node of the cell.

According to an embodiment, the cell further comprises an additional restarting circuit, the additional restarting circuit comprising a variable-resistance element connected between the additional floating node of the cell and the application node for applying a reference potential of the cell.

According to an embodiment:
the variable-resistance element of the restarting circuit has a control terminal connected to the additional floating node of the cell; and
the variable-resistance element of the restarting circuit has a control circuit connected to the floating node of the cell.

A further embodiment provides a logic circuit comprising a first logic cell as defined above and a second logic cell as defined above cascaded in series with the first cell, the first cell having its floating node connected to the node for applying the first input logic signal of the second cell.

BRIEF DESCRIPTION OF THE DRAWINGS

The foregoing features and their advantages, as well as others, will be described in detail in the following description of specific embodiments given by way of illustration and not limitation with reference to the accompanying drawings, in which.

DESCRIPTION OF EMBODIMENTS

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the described embodiments herein have been illustrated and described in detail. In particular, the uses that can be made of the described elementary logic cells have not been described in detail, the described embodiments being compatible with the conventional uses of elementary logic cells in electronic circuits.

Unless indicated otherwise, when reference is made to two elements that are connected together, this means a direct connection without any intermediate elements other than conductors, and when reference is made to two elements that are linked or coupled together, this means that these two elements can be connected or be linked or coupled by way of one or more other elements.

Unless specified otherwise, the expressions "around", "approximately", "substantially" and "in the order of" signify within 10%, and preferably within 5%.

In the described examples, the input and output logical signals of a logic cell correspond to voltages referenced with respect to a reference node GND of the cell, the level of which determines the value, high or low, of the logic signal. Unless indicated otherwise, a logic signal is understood to be a signal that can only have two values, a high value, corresponding, for example, to a voltage close to the supply voltage of the cell, or a low value, corresponding, for example, to a voltage close to 0 V.

The realisation of elementary cells in capacitive adiabatic logic is more specifically of interest here. In this case, the supply voltage of each cell is a periodic variable voltage, and the input and output logic signals of each cell correspond to periodic variable voltages, the amplitude of which determines the value, high or low, of the logic value. One speaks also of a pulse logic or dynamic logic inasmuch as the states of the logic signals are only available during a fraction of the period of a clock signal formed by the supply voltage of the cell. For instance, a logic signal is said to be high (logical 1) when the amplitude of the corresponding voltage is close to the amplitude of the supply voltage of the cell, for example comprised between 1 and 10 volts, and low (logical 0) when the amplitude of the corresponding voltage is close to 0 V, for example less than 0.5 volt.

Figure 1:
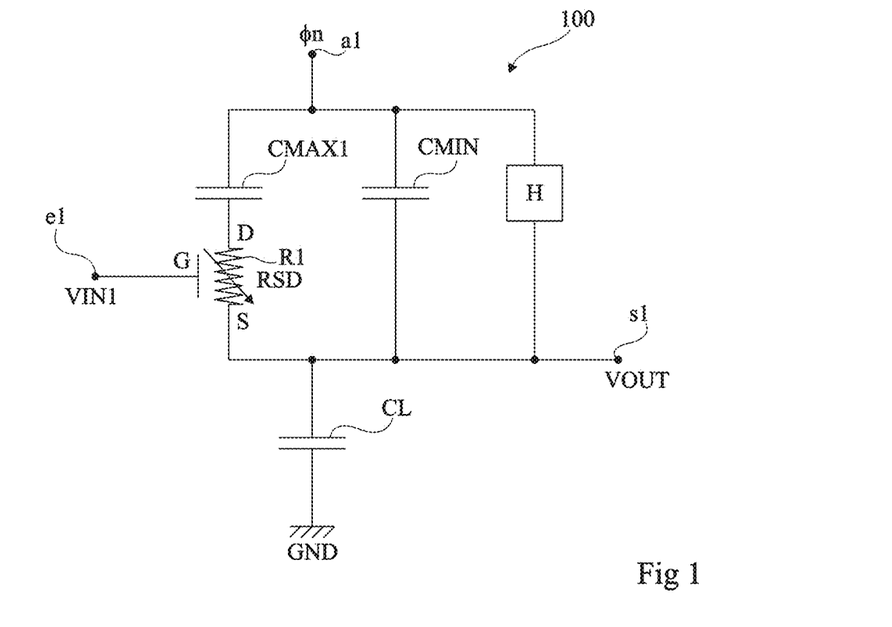
FIG. 1 is a circuit diagram of an example of a capacitive logic cell according to an embodiment.

FIG. 1 is a circuit diagram of an example of an embodiment of a buffer cell 100 in capacitive adiabatic logic.

The cell 100 of FIG. 1 comprises a first capacitor CMIN having a first electrode coupled, for example connected, to an application terminal a1 for applying a supply voltage φn of the cell, referenced with respect to an application node GND for applying a reference potential of the cell, and a second electrode coupled, for example connected, to a terminal s1 for providing an output voltage VOUT of the cell, referenced with respect to the node GND.

The cell 100 of FIG. 1 further comprises, in parallel with the capacitor CMIN, between the terminals a1 and s1 of the cell, an association in series of a second capacitor CMAX1 and a variable-resistance element R1. The variable-resistance element R1 comprises two main conduction terminals S and D, and at least one control terminal G electrically isolated from the main terminals S and D, adapted to receive a control signal in order to make the resistance RSD vary between its terminals S and D.

The variable-resistance element R1 is, for example, a transistor, for example a MOS transistor, the terminals S and D thus corresponding to the conduction terminals of the transistor (for example the source and the drain in the case of a MOS transistor) and the terminal G corresponding to a control terminal of the transistor (the gate in the case of a MOS transistor). In this case, the control signal applied on the terminal G of the element R1 is referenced with respect to the main terminal S or D of the element R1. Preferably, the element R1 is a MOS transistor with a low threshold voltage, for example having a threshold voltage lower than 0.1 V, or even a zero threshold voltage.

As a variant, the element R1 can comprise a second control terminal (not illustrated) also known as a reference control terminal, electrically isolated from the control terminal G and from the main terminals S and D, the control signal applied on the terminal G of the element R1 being referenced with respect to the reference control terminal. An example embodiment of such an element is, for example, a four-terminal electromechanic relay (two main conduction terminals and two control terminals electrically isolated from each other and from the two main conduction terminals).

The control terminal G of the variable-resistance element R1 is coupled, for example connected, to an application terminal e1 for applying an input voltage VIN1 of the cell, for example referenced with respect to the node GND.

In the example shown in FIG. 1, the variable-resistance element R1 is an element with a negative resistance variation, i.e. the resistance RSD between its main terminals S and D is a decreasing function of the voltage applied on its control electrode G. This is represented by an oblique arrow pointing downward in the illustration shown in FIG. 1. The cells described in the following in relation to FIGS. 3 to 8 can also comprise elements with a positive resistance variation, i.e. in which the resistance RSD between the main terminals S and D is an increasing function of the voltage applied on the control electrode G. In the following, these elements will be represented in a manner similar to the illustration of FIG. 1, but by replacing the oblique arrow pointing downward with an oblique arrow pointing upward. For instance, an element with a negative resistance variation can be constituted by an N-channel MOS transistor and an element with a positive resistance variation can be constituted by a P-channel MOS transistor.

In the cell 100, the element R1 is coupled in series with the capacitor CMAX1 via its main terminals S and D. More specifically, in the illustrated example, the capacitor CMAX1 has a first electrode coupled, for example connected, to the terminal a1 of the cell and a second electrode coupled, for example connected, to the terminal D of the element R1, the terminal S of the element R1 being coupled, for example connected, to the output terminal s1 of the cell.

In FIG. 1, a capacitor CL connected between the output terminal s1 and the reference node GND has been illustrated, representing the output capacitance of the cell. In practice, the output capacitance CL may not comprise any components specifically realised and connected to the output node s1, but may correspond to the sum of the capacitances of the various elements coupled to the node s1, in particular interconnecting tracks, or a further capacitive logic cell (not illustrated) the input of which can be coupled to the node s1. As a variant, the capacitor CL can be a specifically added component.

The capacitance of the capacitor CMIN is lower than the capacitance of the capacitor CMAX1. Preferably, the capacitance of the capacitor CMIN is low with respect to the output capacitance CL of the cell, and the capacitance of the capacitor CMAX1 is high with respect to the capacitance CL. For example, the capacitance of the capacitor CMIN is at least ten times lower than the capacitance CL and the capacitance of the capacitor CMAX1 is at least ten times higher than the capacitance CL.

In the example shown in FIG. 1, the buffer cell 100 further comprises a maintaining circuit H adapted to maintain the output voltage VOUT of the cell at a high level during transition phases of the input voltage VIN1 of the cell from a high level to a low level.

Figure 2:
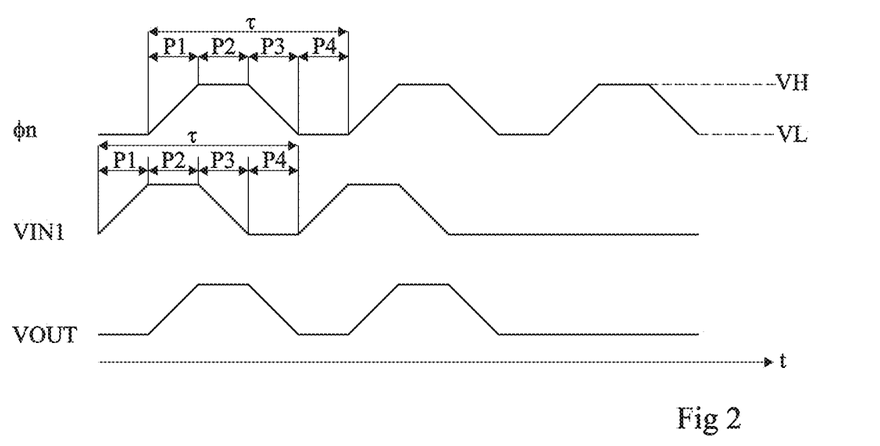
FIG. 2 is a time chart depicting an example of an embodiment of the cell shown in FIG. 1.

FIG. 2 is a graph depicting the operation of the buffer cell 100 shown in FIG. 1. More specifically, FIG. 2 depicts the progression, as a function of time t (in the abscissa), of the supply voltage or supply clock φn, of the input voltage VIN1, and of the output voltage VOUT of the cell shown in FIG. 1.

The supply voltage φn is a periodic variable voltage, provided by a variable voltage source not illustrated in FIG. 1. The voltage φn varies in a periodic and continuous manner between a low value VL, for example comprised between 0 and 2 volts, and a high value VH, for example greater than the value VL by at least 1 volt. In the illustrated example, the supply voltage φn is a trapezoidal voltage. More specifically, in this example, each period τ of the voltage φn comprises four successive phases P1, P2, P3 and P4 substantially of the same duration T=τ/4. During the phase P1, the voltage φn increases in a linear manner from its low value VL until its high value VH. During the phase P2, the voltage φn remains substantially constant and equal to its high value VH. During the phase P3, the voltage φn decreases in a linear manner from its high value VH until its low value VL. During the phase P4, the voltage φn remains substantially constant and equal to its low value VL.

The voltages VIN1 and VOUT are synchronised to the supply voltage φn, which also acts as a clock signal. The voltages VIN1 and VOUT have a periodic variation in form substantially identical to that of the variable supply voltage φN. The voltages VIN1 and VOUT respectively define logic signals IN1 and OUT. The logic signal IN, respectively OUT, is high when the amplitude of the periodic variable voltage VIN1, respectively VOUT, is at a high level, for example close to the amplitude of the supply voltage φn, and is at a low level when the amplitude of the periodic variable voltage VIN1, respectively VOUT, is at a low level, for example close to 0 volt. The voltage VIN1 has a phase lead in the order of T=τ/4 with respect to the supply voltage φn. The voltage VOUT is in turn in phase with the supply voltage φn.

In the example illustrated in FIG. 2, the input signal IN1 is high during two successive periods τ of the supply signal φn, then becomes low.

The output voltage VOUT depends on the ratio between the capacitance CL and the equivalent capacitance of the association in parallel of the capacitor CMIN and the branch comprising the capacitor CMAX1 and the variable-resistance element R1. For a logical 0 of the input signal IN1 (voltage VIN1 with an amplitude close 0 volt), the resistance RSD of the element R1 is at a high value (corresponding, for example, in the case of a transistor, to the resistance in the off state of the transistor), so that the equivalent capacitance of the cell between the terminals a1 and s1 is relatively low (RSD much lower than the impedance of the capacitor CMAX1), for example substantially equal to the capacitance of the capacitor CMIN on its own (by considering the time of increase T=τ/4 of the supply voltage φn as negligible with respect to the time constant of the branch comprising the element R1 and the capacitor CMAX1). The voltage pulse VOUT transmitted on the output terminal s1 of the cell is thus at a low level of amplitude, for example close to 0 volt. For a logical 1 of the input signal IN1 (voltage VIN1 with an amplitude close to the amplitude of the supply voltage φn), the resistance RSD of the element R1 decreases until a low value (corresponding, for example, in the case of a transistor, to the resistance in the on state of the transistor), so that the equivalent capacitance of the cell between the terminals a1 and s1 increases until a relatively high value (RSD much greater than the impedance of the capacitor CMAX1), for example substantially equal to the capacitance of the capacitor CMAX1 (by considering the capacitance of the capacitor CMIN as negligible with respect to the capacitance of the capacitor CMAX1). A pulse of voltage VOUT is thus obtained on the output terminal s1 of the cell that has a high level of amplitude, for example close to the amplitude of the supply voltage φn.

By means of the maintaining circuit H inside the buffer cell, it is possible to maintain between the supply terminal a1 and the output terminal s1 of the cell, during the phase of decline of the high-level pulse of the input voltage VIN1 of the cell (phase P3 of the voltage VIN1, corresponding to the phase P2 of the voltage φn), a capacitance substantially equal to the high value of the equivalent capacitance of the association in parallel of the capacitor CMIN and the branch comprising the capacitor CMAX1 and the variable-resistance element R1, which makes it possible to provide as an output of the cell a high-level pulse of the same form (trapezoidal in this example) as the supply voltage φn.

Thus, the cell 100 copies on its output terminal s1 a signal OUT having the same logic state as the signal IN1 applied on its input terminal e1.

In the example described above of a four-phase operation, in a logic circuit comprising a plurality of cells cascaded in series, each cell receives, on its supply terminal a1 a periodic variable voltage φn with a phase delay of approximately T=τ/4 with respect to the supply voltage of the preceding cell. This allows, in each cell, the input logic signal of the cell (corresponding to the output logic signal of the preceding cell) to be in phase lead by approximately T=τ/4 with respect to the supply voltage of the cell as depicted in FIG. 2. Thus, in a logic circuit comprising a number greater than or equal to 4 elementary cells cascaded in series, four similar supply voltages φ1, φ2, φ3, φ4 will be provided, i.e. of the same frequency, of the same form and of the same amplitude level, but out of phase in pairs by approximately π/2.

In practice, the trapezoidal supply voltages φn can be approximated by sinusoidal voltages with the period τ.

An advantage of the buffer cell 100 shown in FIG. 1 is that it does not comprise a variable-capacitance capacitor, but exclusively fixed-capacitance capacitors and a variable-resistance element. These components can be realised relatively easily and in a relatively compact manner by conventional methods for realising integrated circuits, for example using CMOS technology. For instance, the fixed-capacitance capacitors CMIN and CMAX1 are capacitors of the metal-insulator-metal type.

With respect to cells based on variable-capacitance capacitors of the type described in the aforementioned patent application EP3182590, the advantage of reducing leakage currents is preserved inasmuch as there is no direct path of resistance between the supply terminal a1 and the reference terminal GND of the cell.

A further advantage of the cell 100 is that the variable-resistance element R1 can be controlled by lower voltages than the variable-capacity capacitors of the cells of the type described in the aforementioned patent application EP3182590. The amplitude of the supply voltage φn of the cell can thus also be reduced. For instance, the amplitude of the supply voltage φn of the cell 100 can be lower than 5 V, or even lower than 2 V, which makes it possible to obtain logic circuits with a very low electrical consumption.

Figure 3:
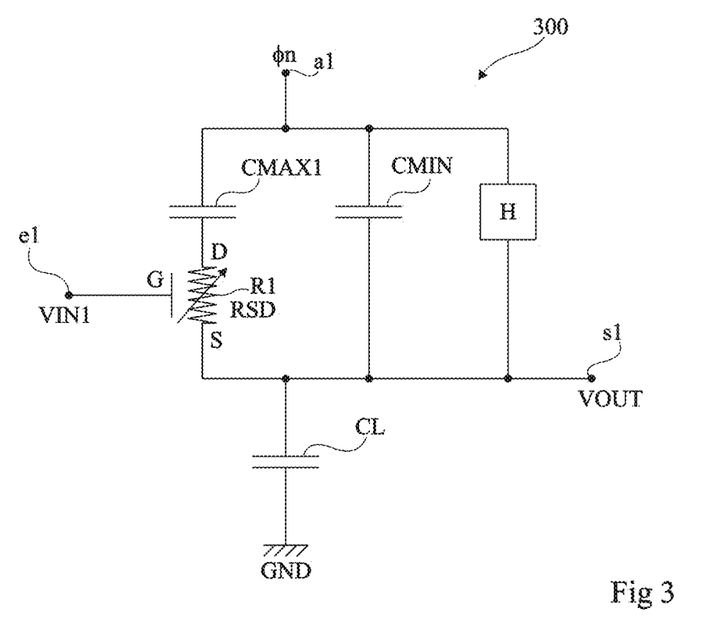
FIG. 3 is a circuit diagram of a further example of a capacitive logic cell according to an embodiment.

FIG. 3 is a circuit diagram of an example of an embodiment of an inverting cell 300 in capacitive adiabatic logic.

The cell 300 differs from the cell 100 shown in FIG. 1 essentially in that, in the cell 300, the variable-capacitance element R1 is an element with a positive resistance variation.

Thus, for a logical 0 of the input signal IN1 (voltage VIN1 with an amplitude close to 0 volt), the resistance RSD of the element R1 is at a low value (corresponding, for example, in the case of a transistor, to the resistance in the on state of the transistor), so that the equivalent capacitance of the cell between the terminals a1 and s1 is relatively high, for example substantially equal to the capacitance of the capacitor CMAX1. A pulse of voltage VOUT is thus obtained on the output terminal s1 of the cell that has a high level of amplitude, for example close to the amplitude of the supply voltage φn. For a logical 1 of the input signal IN1 (voltage VIN1 with an amplitude close to the amplitude of the supply voltage φn), the resistance RSD of the element R1 increases until a high value (corresponding, for example, in the case of a transistor, to the resistance in the off state of the transistor), so that the equivalent capacitance of the cell between the terminals a1 and s1 decreases until a relatively low value, for example substantially equal to the capacitance of the capacitor CMIN. The pulse of voltage VOUT transmitted on the output terminal s1 of the cell is thus at a low level of amplitude, for example close to 0 V.

Thus, the cell 300 provides on its output terminal s1 an inverse logic signal OUT of the logic signal IN1 applied on its input terminal e1.

Figure 4:
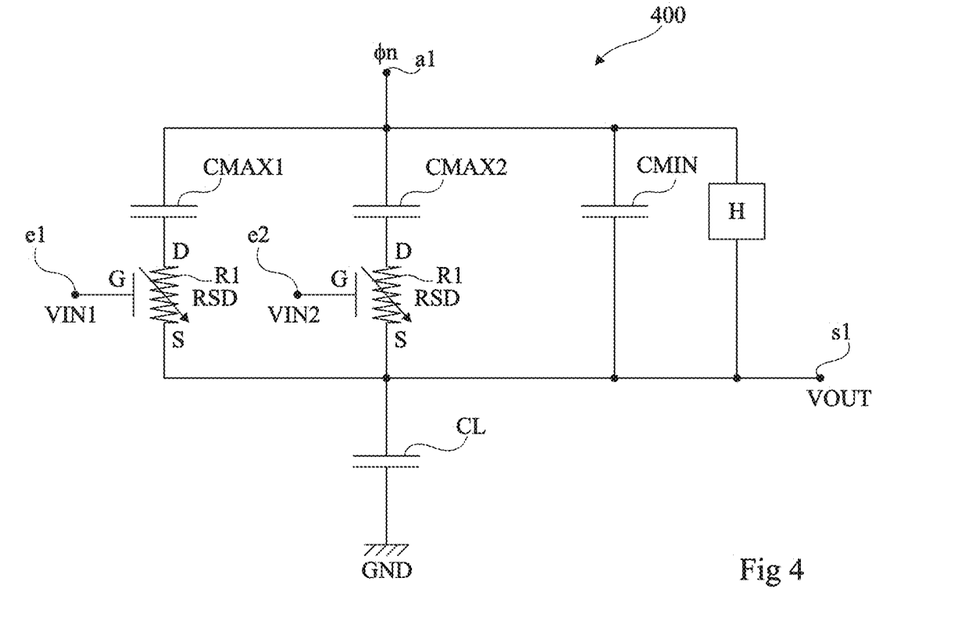
FIG. 4 is a circuit diagram of a further example of a capacitive logic cell according to an embodiment.

FIG. 4 is a circuit diagram of an example of an embodiment of a cell 400 of the AND type in capacitive adiabatic logic.

The cell 400 comprises the same elements as the cell 100 of FIG. 1, arranged substantially in the same manner, and further comprises, between the terminals a1 and s1 of the cell, in parallel with the capacitor CMIN and with the branch comprising the capacitor CMAX1 and the element R1, an association in series of a capacitor CMAX2 and a variable-resistance element R2. The capacitor CMAX2 has, for example, substantially the same capacitance as the capacitor CMAX1. For example, the capacitor CMAX2 is identical to the capacitor CMAX1 with the exception of manufacturing dispersions. The variable-resistance element R2 comprises, like the element R1, two main conduction terminals S and D, and at least one control terminal G electrically isolated from its main terminals S and D, adapted to receive a control signal in order to make the resistance RSD vary between its terminals S and D. In this example, the element R2 is, like the element R1, an element with a negative resistance variation. For instance, the element R2 is identical to the element R1 with the exception of manufacturing dispersions.

The control terminal G of the variable-resistance element R2 is coupled, for example connected, to an application terminal e2 for applying an input voltage VIN2 of the cell, for example referenced with respect to the node GND.

In the cell 400, the element R2 is coupled in series with the capacitor CMAX2 via its main terminals S and D. More specifically, in the illustrated example, the capacitor CMAX2 has a first electrode coupled, for example connected, to the terminal a1 of the cell and a second electrode coupled, for example connected, to the terminal D of the element R2, the terminal S of the element R2 being coupled, for example connected, to the output terminal s1 of the cell.

The capacitance of the capacitor CMIN is lower than the sum of capacitances of the capacitors CMAX1 and CMAX2. For instance, the capacitance of the capacitor CMIN is at least ten times lower than the sum of the capacitances of the capacitors CMAX1 and CMAX2. Preferably, the capacitance of the capacitor CMIN is low with respect to the output capacitance CL of the cell, and the sum of the capacitances of the capacitors CMAX1 and CMAX2 is high with respect to the capacitance CL. In addition, preferably, the sum of the capacitances of the capacitors CMAX1 and CMIN and the sum of the capacitances of the capacitors CMAX2 and CMIN are lower than the capacitance CL.

The operation of the cell 400 of FIG. 4 is similar to what has been described above. In particular, the form of the supply voltage φn, of the input voltages VIN1 and VIN2 and of the output voltage VOUT can be identical or similar to what has been described in the foregoing.

The output voltage VOUT depends on the ratio between the capacitance CL and the equivalent capacitance of the association in parallel of the capacitor CMIN, the branch comprising the capacitor CMAX1 and the variable-resistance element R1, and the branch comprising the capacitor CMAX2 and the variable-resistance element R2. When the input signals IN1 and IN2 are both in the low state (voltage VIN1 with an amplitude close to 0 volt and voltage VIN2 with an amplitude close to 0 volt), the resistance RSD of the element R1 and the resistance RSD of the element R2 are both at a high value, so that the equivalent capacitance of the cell between the terminals a1 and s1 is relatively low, for example substantially equal to the capacitance of the capacitor CMIN on its own. The pulse of voltage VOUT transmitted on the output terminal s1 of the cell is thus at a low level of amplitude, for example close to 0 volt. When the input signals IN1 and IN2 are respectively in the high state and in the low state (voltage VIN1 with an amplitude close to the amplitude of the supply voltage φn and voltage VIN2 with an amplitude close to 0 volt), the resistance RSD of the element R1 decreases until a low value, so that the equivalent capacitance of the cell between the terminals a1 and s1 increases until an intermediate value, for example substantially equal to the capacitance of the capacitor CMAX1 by considering the capacitance of the capacitor CMIN as negligible with respect to the capacitance of the capacitor CMAX1. A pulse of voltage VOUT is thus obtained on the output terminal s1 of the cell that has an intermediate level of amplitude interpreted as a low logic level of the output signal. In a similar manner, when the input signals IN1 and IN2 are respectively in the low state and in the high state (voltage VIN1 with an amplitude close to 0 volt and voltage VIN2 with an amplitude close to the amplitude of the supply voltage φn), the resistance RSD of the element R2 decreases until a low value, so that the equivalent capacitance of the cell between the terminals a1 and s1 increases until an intermediate value, for example substantially equal to the capacitance of the capacitor CMAX2 by considering the capacitance of the capacitor CMIN as negligible with respect to the capacitance of the capacitor CMAX2. A pulse of voltage VOUT is thus obtained on the output terminal s1 of the cell that has an intermediate level of amplitude interpreted as a low logic level of the output signal. When the input signals IN1 and IN2 are both in the high state (voltage VIN1 with an amplitude close to the amplitude of the supply voltage φn and voltage VIN2 with an amplitude close to the amplitude of the supply voltage φn), the resistance RSD of the element R1 and the resistance RSD of the element R2 decrease until a low value, so that the equivalent capacitance of the cell between the terminals a1 and s1 increases until a high value, for example substantially equal to the sum of the capacitances of the capacitors CMAX1 and CMAX2 by considering the capacitance of the capacitor CMIN as negligible. A pulse of voltage VOUT is thus obtained on the output terminal s1 of the cell that has a high level of amplitude, for example close to the amplitude of the supply voltage φn, interpreted as a high logic level of the output signal. The cell 400 thus realises an AND function OUT=IN1·IN2).

As a variant, the cell 400 of FIG. 4 can realise an OR function by modifying the capacitances of the capacitors CMAX1 and CMAX2.

More generally, various basic logic functions, and in particular the functions OR, NOR and NAND, can be realised by playing with the arrangement in series and/or parallel of the capacitors CMAX1 and CMAX2 and the elements R1 and R2, and/or with the direction of variation (negative or positive) of the resistance of the elements R1 and/or R2.

Figure 5:
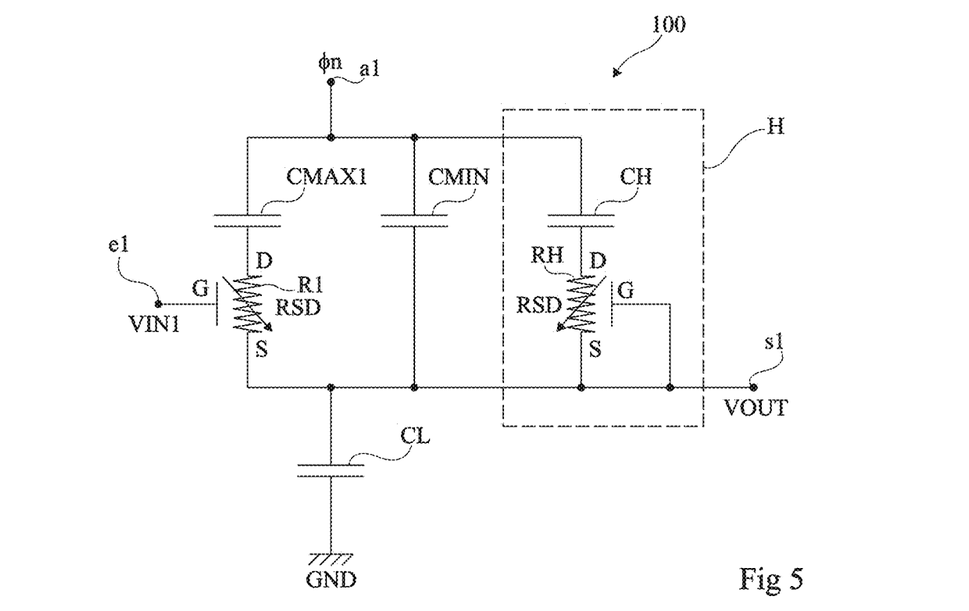
FIG. 5 is a circuit diagram depicting in greater detail an example embodiment of the capacitive logic cell shown in FIG. 1.

FIG. 5 is a circuit diagram depicting in greater detail an example embodiment of the capacitive logic cell shown in FIG. 1. FIG. 5 shows the same elements as FIG. 1, and depicts in greater detail an example embodiment of the maintaining circuit H of the cell 100 shown in FIG. 1.

In this example, the maintaining circuit H is constituted by an association in series, between the terminals a1 and s1 of the cell, in parallel with the capacitor CMIN and with the branch comprising the capacitor CMAX1 and the variable-resistance element R1, of a capacitor CH and a variable-resistance element RH.

The capacitor CH has, for example, substantially the same capacitance as the capacitor CMAX1. For example, the capacitor CH is identical to the capacitor CMAX1 with the exception of manufacturing dispersions. The variable-resistance element RH comprises, like the element R1, two main conduction terminals S and D, and at least one control terminal G electrically isolated from its main terminals S and D, adapted to receive a control signal in order to make the resistance RSD vary between its terminals S and D. In this example, the element RH is, like the element R1, an element with a negative resistance variation.

In this example, the element RH is coupled in series with the capacitor CH via its main terminals S and D. More specifically, in the illustrated example, the capacitor CH has a first electrode coupled, for example connected, to the terminal a1 of the cell and a second electrode coupled, for example connected, to the terminal D of the element RH, the terminal S of the element RH being coupled, for example connected, to the output terminal s1 of the cell. The control terminal G of the variable-resistance element RH is coupled, for example connected, to the output terminal s1 of the cell.

Preferably, the element RH is a MOS transistor with a low threshold voltage, for example with a threshold voltage lower than 0.1 V and preferably zero, or a four-terminal electromechanical relay, the fourth terminal (or reference control terminal) being coupled, for example connected, to the node GND.

When the input voltage VIN1 returns to its low value following a high-level pulse (phase P3 of the voltage VIN1, corresponding to the phase P2 of the voltages φn and VOUT), the capacitor CH replaces the capacitor CMAX1 in order to maintain the voltage VOUT at a high level.

More generally, any other circuit can be used to replace the circuit H shown in FIG. 5 by means of which it is possible to maintain between the terminals a1 and s1, during the phase of decline of the high-level pulse of the input voltage VIN1 of the cell (phase P3 of the voltage VIN1), a capacitance substantially equal to the high value of the equivalent capacitance of the association in parallel of the capacitor CMIN and the branch comprising the capacitor CMAX1 and the variable-resistance element R1.

Figure 6:
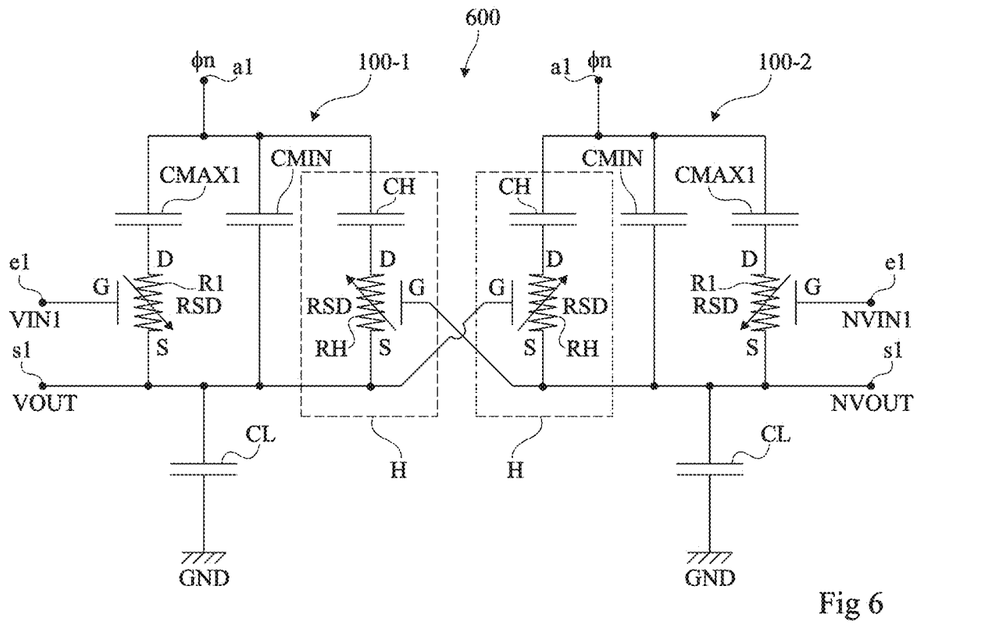
FIG. 6 is a circuit diagram of a further example of a capacitive logic cell according to an embodiment.

FIG. 6 is a circuit diagram of a further example of an embodiment of an elementary cell 600 in capacitive adiabatic logic. FIG. 6 depicts more specifically a further example embodiment of the maintaining function, by coupling in parallel two identical logic cells receiving complementary input logic signals. In the example shown in FIG. 6, the cell 600 is a buffer/inverting cell.

The cell 600 of FIG. 6 comprises two buffer cells 100_1 and 100_2. The cells 100_1 and 100_2 are identical or similar to the cell 100 shown in FIG. 5, with the exception that:

in each of the cells 100_1 and 100_2, the variable-resistance element RH of the maintaining circuit is an element with a positive resistance variation;

in the cell 100_1, the control terminal G of the variable-resistance element RH of the maintaining circuit H is connected, not to the output terminal s1 of the cell 100_1, but to the output terminal s1 of the cell 100_2; and in the cell 100_2, the control terminal G of the variable-resistance element RH of the maintaining circuit H is connected, not to the output terminal s1 of the cell 100_2, but to the output terminal s1 of the cell 100_1.

The cells 100_1 and 100_2 receive the same supply voltage φn on their respective supply terminals, and have their nodes GND connected to a same application node for applying a reference potential. During operation, the input terminal e1 of the cell 100_1 receives an input voltage VIN1 representative of an input logic signal IN1 of the cell 600, and the input terminal a1 of the cell 100_2 receives an input voltage NVIN1 representative of a logic signal NIN1 complementary to the signal IN1.

The cell 600 provides, on the output terminal s1 of the cell 100_1, a logic signal OUT (in the form of a periodic variable voltage VOUT) having the same logic state as the signal IN1, and, on the output terminal s1 of the cell 100_2, a logic signal NOUT (in the form of a periodic variable voltage NVOUT) complementary to the signal IN1.

Figure 7:
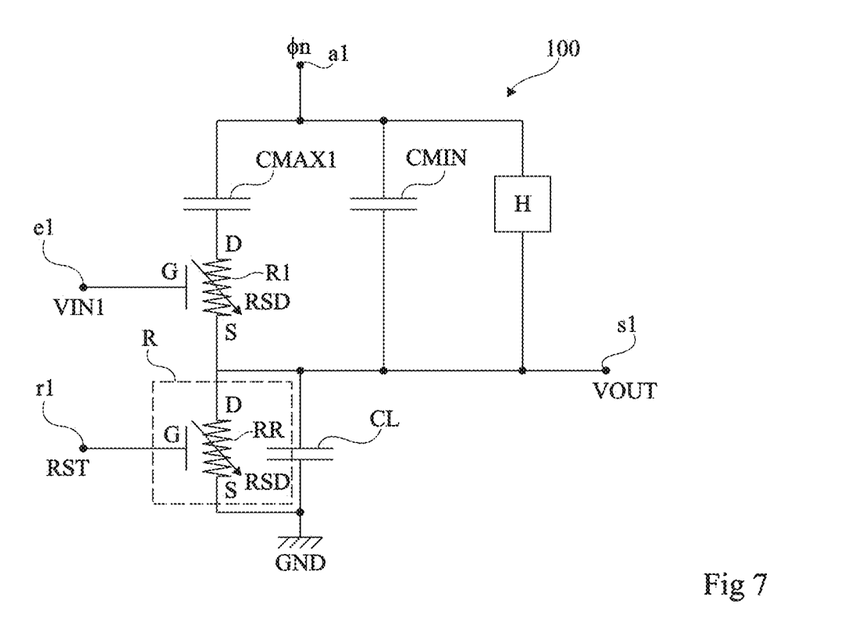
FIG. 7 is a circuit diagram of a further example of a capacitive logic cell according to an embodiment.

FIG. 7 is a circuit diagram of a variant embodiment of the buffer cell 100 shown in FIG. 1.

The cell 100 of FIG. 7 comprises the same elements as in the example shown in FIG. 1, arranged substantially in the same manner, and further comprises a restarting circuit R by means of which it is possible to restart the floating output node s1 of the cell at a reference potential. In this example, the restarting circuit R comprises a variable-resistance element RR coupling, via its conduction nodes, the output node s1 of the cell to the reference node GND of the cell (in parallel with the output capacitance CL of the cell). In this example, the element RR is an element with a negative capacitance variation. The element RR is, for example, similar to the element R1. However, the dimensions of the element RR can be different from those of the element R1. In practice, the dimensions of the element RR can be smaller than those of the element R1 inasmuch as the element RR exclusively serves the purpose of evacuating possible residual electrical charges accumulated on the node s1.

The conduction terminal D of the element RR is coupled, for example connected, to the output node s1 of the cell, and the conduction terminal S of the element RR is coupled, for example connected, to the reference node GND of the cell. The control terminal G of the element RR is coupled, for example connected, to an application node r1 for applying a restart control signal RST for restarting the cell.

By applying a control signal at a low value of the resistance of the element RR, it is possible to restart the output node s1 of the cell substantially at the potential of the reference node GND of the cell. By applying a control signal at a high value of the resistance of the element RR, it is possible to isolate the output node s1 of the cell from the reference node GND. In practice, an identical or similar restarting circuit can be provided in all the capacitive logic cells described in the foregoing and in particular in the cells of FIGS. 3, 4, 5 and 6.

The restarting circuit R can be activated at each period of the power clock, but is not necessarily activated at each period of the power clock. Furthermore, the element RR can have a positive activation (i.e. the element RR is rendered slightly resistive by application of a high-level signal RST) or a negative activation (i.e. the element RR is rendered slightly resistive by application of a low-level signal RST).

Figure 8:
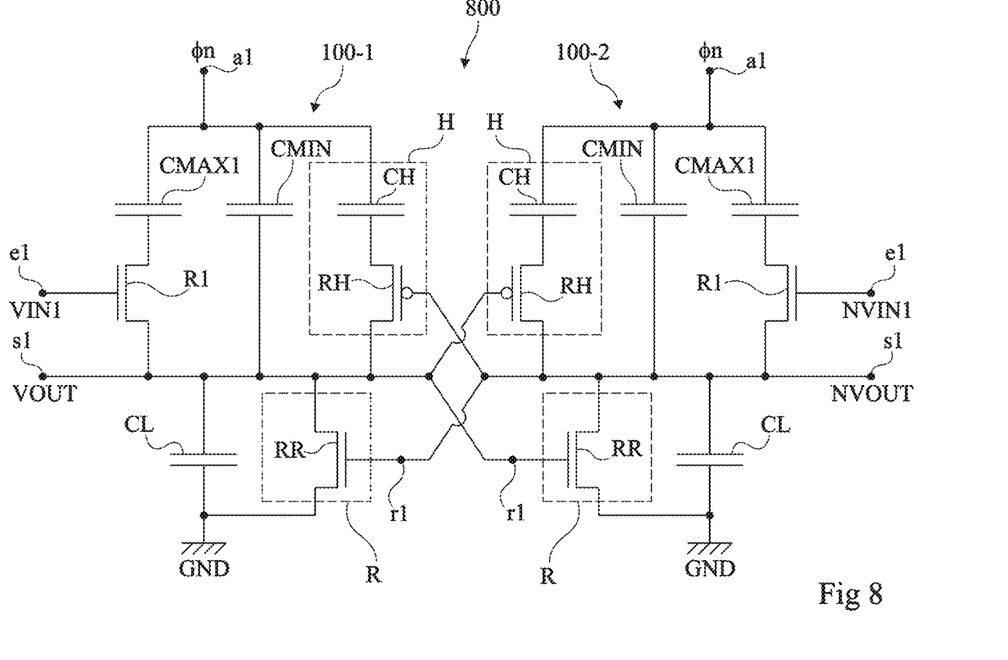
FIG. 8 is a circuit diagram of a further example of a capacitive logic cell according to an embodiment.

FIG. 8 depicts an example of an embodiment of an elementary cell 800 in capacitive adiabatic logic.

The cell 800 combines the variant embodiments of FIGS. 6 and 7 and uses MOS transistors as variable-resistance elements. More specifically, in the example shown in FIG. 8, the elements with a negative resistance variation are N-channel MOS transistors and the elements with a positive resistance variation are P-channel MOS transistors.

Thus, in each of the cells 100_1 and 100_2, the element R1 is an N-channel MOS transistor the source and the drain of which are respectively connected to the output node s1 of the cell and to an electrode of the capacitor CMAX1 of the cell and the gate of which is connected to the input node e1 of the cell. In addition, in each of the cells 100_1 and 100_2, the element RH is a P-channel MOS transistor the source and the drain of which are respectively connected to an electrode of the capacitor CH and to the output node s1 of the cell, the gate of the transistor RH of the cell 100_1 being connected to the output node s1 of the cell 100_2 and the gate of the transistor RH of the cell 100_2 being connected to the output node s1 of the cell 100_1. Moreover, in each of the cells 100_1 and 100_2, the element RR is an N-channel MOS transistor the source and the drain of which are respectively connected to the reference node GND of the cell and to the output node s1 of the cell, and the gate of which is connected to the control node r1 of the restarting circuit R of the cell.

In this example, the control node r1 of the restarting circuit R of the cell 100_1 is coupled, preferably connected, to the output node s1 of the cell 100_2, and the control node r1 of the restarting circuit R of the cell 100_2 is coupled, preferably connected, to the output node s1 of the cell 100_1. This allows the output node s1 of the cell 100_1 and the output node s1 of the cell 100_2 to be restarted at each period of the supply signal φn.

Elementary cells for a capacitive adiabatic logic circuit have been described that are compatible with an embodiment of the type described in relation to FIG. 2, allowing an unlimited number of cells to be cascaded in series by using four supply/clock signals φ1, φ2, φ3 and φ4 that are out of phase in pairs by 90 degrees. The described embodiments are, however, not limited to this particular embodiment. As a variant, it is possible to provide a logic circuit that works with a so-called retractable supply/clock architecture, also known as Bennett clocking architecture.

Figure 9:
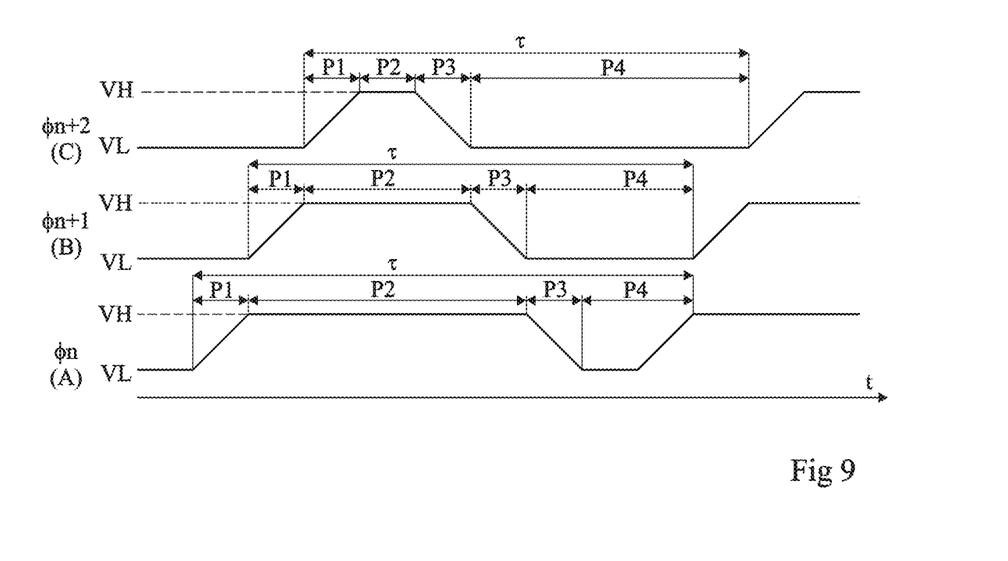
FIG. 9 is a time chart depicting a further example of an embodiment of a capacitive logic cell according to an embodiment.

FIG. 9 is a time chart depicting an example embodiment of a Bennett clocking logic circuit. Considered in this example is a circuit comprising three cells A, B and C, for example of the type described above, cascaded in series. More specifically, the cell A, called row n, has an output terminal coupled, for example connected, to an input terminal of the cell B, called row n+1, and the cell B has an output terminal coupled, for example connected, to an input terminal of the cell C, called row n+2. The cell A receives on its supply terminal a1 a supply voltage φn, the cell B receives on its supply terminal a1 a supply voltage φn+1, and the cell C receives on its supply terminal a1 a voltage φn+2. The voltages φn, φn+1 and φn+2 are illustrated in FIG. 9.

Each of the voltages φn, φn+1 and φn+2 varies in a periodic manner between a low value VL and a high value VH. As is evident from FIG. 9, the voltages φn, φn+1 and φn+2 have substantially the same period τ. However, the voltages φn, φn+1 and φn+2 do not have the same cyclical ratio. In this example, the time of ascent from the low value VL to the high value VH (phase P1) and the time of descent from the high value VH to the low value VL (phase P3) is substantially the same for each of the voltages φn, φn+1 and φn+2. However, the time of maintaining at the high level VH the supply voltage (phase P2) is greater for the voltage φn than for the voltage φn+1 and is greater for the voltage φn+1 than for the voltage φn+2. More specifically, the phase P2 of the voltage φn starts at the beginning of the phase P1 of the voltage φn+1 and ends at the end of the phase P3 of the voltage φn+1, and the phase P2 of the voltage φn+1 starts at the beginning of the phase P1 of the voltage φn+2 and ends at the end of the phase P3 of the voltage φn+2. Conversely, the time of maintaining at the low level VL the supply voltage (phase P4) is less for the voltage φn than for the voltage φn+1 and is less for the voltage φn+1 than for the voltage φn+2. More specifically, the phase P4 of the voltage φn+2 starts at the beginning of the phase P3 of the voltage φn+1 and ends at the end of the following phase P1 of the voltage φn+1, and the phase P4 of the voltage φn+1 starts at the beginning of the phase P3 of the voltage φn and ends at the end of the following phase P1 of the voltage φn.

In this embodiment, the number of logic cells potentially being cascaded in series is limited by the number of available nested supply voltages n φn. However, an advantage is that the maintaining circuits H of the logic cells described in the foregoing can be omitted.

Various embodiments and variants have been described. Those skilled in the art will understand that certain features of these embodiments can be combined and other variants will readily occur to those skilled in the art. In particular, although only example embodiments based on two-state logic signals have been described above, the described embodiments can be adapted for the implementation of a multi-level logic, i.e. in which the data signals can have a number of distinct states greater than 2. For this purpose, it is possible to add further fixed-capacitance capacitors and further variable-resistance elements for modulating the capacitive ratio between the capacitance CL and the equivalent capacitance between the supply node a1 and output node s1 of the cells on a number of levels greater than 2. The different variable-resistance elements of a same logic cell can thus have different switching voltages.

What is claimed is:

1. A logic circuit comprising a first logic cell and a second logic cell cascaded in series, each logic cell comprising:
   a first fixed-capacitance capacitor connected between a first application node for applying a supply voltage of the cell and a first floating node for providing an output logic signal of the cell; and
   connected in parallel with the first fixed-capacitance capacitor, an association in series of a second fixed-capacitance capacitor and a first variable-resistance element, the first variable-resistance element comprising a first control electrode connected to a second application node for applying a first input logic signal of the cell, the first logic cell having its first floating node connected to the second application node of the second logic cell for applying the first input logic signal of the second logic cell.

2. The logic circuit of claim 1, wherein, in at least one of the first and second logic cells, the first variable-resistance element is an element with a negative resistance variation.

3. The logic circuit of claim 1, wherein, in at least one of the first and second logic cells, the first variable-resistance element is an element with a positive resistance variation.

4. The logic circuit of claim 1, wherein, in at least one of the first and second logic cells, the first variable-resistance element is a MOS transistor.

5. The logic circuit of claim 1, wherein, in at least one of the first and second logic cells, the first variable-resistance element is an electromechanical relay.

6. The logic circuit of claim 1, wherein at least one of the first and second logic cells further comprises, connected in parallel with the first fixed-capacitance capacitor of the at least one of the first and second logic cells, an association in series of a third capacitor and a second variable-resistance element, the second variable-resistance element comprising a second control electrode connected to a third application node for applying a second input logic signal of the at least one of the first and second logic cells.

7. The logic circuit of claim 1, wherein at least one of the first and second logic cells, further comprises a capacitive maintaining circuit connected between the supply node and the first floating node of the at least one of the first and second logic cells.

8. The logic circuit of claim 7, wherein, in said at least one of the first and second logic cells, the capacitive maintaining circuit comprises an association in series of a capacitor and a variable-resistance element.

9. The logic circuit of claim 1, wherein at least one of the first and second logic cells, further comprises a restarting circuit connected between the first floating node and a third application node for applying a reference potential of the at least one of the first and second logic cells.

10. The logic circuit of claim 9, wherein, in said at least one of the first and second logic cells, the restarting circuit comprises a variable-resistance element connected between the first floating node and the third application node for applying the reference potential of the at least one of the first and second logic cells.

11. The logic circuit of claim 1, wherein at least one of the first and second logic cells further comprises:
   a third fixed-capacitance capacitor connected between the first application node for applying the supply voltage of the at least one of the first and second logic cells and a second floating node for providing a complementary output logic signal to the output logic signal from the at least one of the first and second logic cells; and
   connected in parallel with the third fixed-capacitance capacitor, an association in series of a fourth fixed-capacitance capacitor and a second variable-resistance element, the second variable-resistance element comprising a second control electrode connected to a third application node for applying a logic signal that is complementary to the first input logic signal of the at least one of the first and second logic cells.

12. The logic circuit of claim 11, wherein said at least one of the first and second logic cells, further comprises a capacitive maintaining circuit, the capacitive maintaining circuit comprising an association in series of a capacitor and a variable-resistance element connected between the supply node and the first floating node of the at least one of the first and second logic cells.

13. The logic circuit of claim 12, wherein, in said at least one of the first and second logic cells, the variable-resistance element of the capacitive maintaining circuit has a control terminal connected to the second floating node of the at least one of the first and second logic cells.

14. The logic circuit of claim 11, wherein said at least one of the first and second logic cells further comprises a restarting circuit, the restarting circuit comprising a variable-resistance element connected between the first floating node of the at least one of the first and second logic cells and a fourth application node for applying a reference potential to the at least one of the first and second logic cells.

15. The logic circuit of claim 14, wherein
   the variable-resistance element of the restarting circuit has a control terminal connected to the second floating node of the at least one of the first and second logic cells.

16. The logic circuit of claim 1, wherein, in one logic cell of the first and second logic cells:
   at a first logical state of the first input logic signal of the one logic cell, an equivalent capacitance of a parallel combination of the first fixed-capacitance capacitor and the association in series of the second fixed-capacitance capacitor and the first variable-resistance element is substantially equal to a first capacitance of the first fixed-capacitance capacitor; and
   at a second logical state of the first input logic signal of the one logic cell, an equivalent capacitance of the parallel combination of the first fixed-capacitance capacitor and the association in series of the second fixed-capacitance capacitor and the first variable-resistance element is substantially equal to a second capacitance of the second fixed-capacitance capacitor.

* * * * *